(12) United States Patent
Fumitake

(10) Patent No.: US 8,247,864 B2
(45) Date of Patent: Aug. 21, 2012

(54) AMORPHOUS SILICON MONOS OR MAS MEMORY CELL STRUCTURE WITH OTP FUNCTION

(75) Inventor: Mieno Fumitake, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/013,229

(22) Filed: Jan. 25, 2011

(65) Prior Publication Data

US 2011/0204363 A1 Aug. 25, 2011

Related U.S. Application Data

(62) Division of application No. 12/258,950, filed on Oct. 27, 2008, now Pat. No. 7,892,904.

(30) Foreign Application Priority Data

Jul. 2, 2008 (CN) .......................... 2008 1 0040284

(51) Int. Cl.
*H01L 29/792* (2006.01)
(52) U.S. Cl. ................ 257/324; 257/316; 257/E21.614; 438/292
(58) Field of Classification Search .................. None
See application file for complete search history.

(56) References Cited

U.S. PATENT DOCUMENTS

| 5,196,912 A * | 3/1993 | Matsumoto et al. ............ 257/16 |
| 7,892,904 B2 | 2/2011 | Fumitake |
| 2006/0249735 A1 * | 11/2006 | Walker et al. .................. 257/74 |

OTHER PUBLICATIONS

Herner et al, Vertical p-i-n. polysilicon diode with antifuse for stackable field-programmable ROM, IEEE, pp. 271-273, May 2004.*

* cited by examiner

*Primary Examiner* — Evan Pert
*Assistant Examiner* — Andres Munoz
(74) *Attorney, Agent, or Firm* — Kilpatrick Townsend and Stockton LLP

(57) ABSTRACT

A semiconductor device with an amorphous silicon (a-Si) metal-oxide-nitride-oxide-silicon (MONOS) or metal-aluminum oxide-silicon (MAS) memory cell structure with one-time programmable (OTP) function. The device includes a substrate, a first dielectric layer overlying the substrate, and one or more source or drain regions embedded in the first dielectric layer with a co-planar surface of n-type a-Si and the first dielectric layer. Additionally, the device includes a p-i-n a-Si diode junction. The device further includes a second dielectric layer on the a-Si p-i-n diode junction and a metal control gate overlying the second dielectric layer. Optionally the device with OTP function includes a conductive path formed between n-type a-Si layer and the metal control gate. A method of making the same memory cell structure is provided and can be repeated to integrate the structure three-dimensionally.

16 Claims, 6 Drawing Sheets

AMORPHOUS SILICON MONOS OR MAS MEMORY CELL STRUCTURE WITH OTP FUNCTION

CROSS-REFERENCE TO RELATED APPLICATIONS

The present application is a division of U.S. application Ser. No. 12/258,950, filed on Oct. 27, 2008, entitled "AMORPHOUS SILICON MONOS OR MAS MEMORY CELL STRUCTURE WITH OTP FUNCTION," which claims priority to Chinese Patent Application No. 200810040284.1, filed Jul. 2, 2008, commonly assigned, the contents of which are incorporated herein by reference for all purposes.

BACKGROUND OF THE INVENTION

The present invention is directed to integrated circuits and their processing for the manufacture of semiconductor devices. More particularly, the invention provides a semiconductor device having a memory cell and a method for making the device. Merely by way of example, the invention has been applied to an amorphous silicon (a-Si) metal-oxide-nitride-oxide-silicon (MONOS) or metal-aluminum oxide-silicon (MAS) memory cell structure with one time programmable (OTP) function. But it would be recognized that the invention has a much broader range of applicability. For example, the invention can be applied to a variety of devices such as dynamic random access memory devices, static random access memory devices, flash memory devices, and other memory devices including one time programmable function (capable of being written with data only one time), and a method of integrating the device three-dimensionally.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

Over the past, reducing memory devices have been a challenging task. As an example, for non-volatile memory devices the high density memory development is hindered by the inability to scale down the memory cell size without reducing the memory capacitance per unit area. In the past, various conventional techniques have been developed for memory cell structures with reduced dimensions. Unfortunately, these conventional techniques have often been inadequate.

From the above, it is seen that an improved device design and technique for processing semiconductor devices, particularly the three-dimensional (3D) memory cell structure, is desired.

BRIEF SUMMARY OF THE INVENTION

The present invention is directed to integrated circuits and their processing for the manufacture of semiconductor devices. More particularly, the invention provides a semiconductor device having a memory cell and a method for making the device. Merely by way of example, the invention has been applied to an amorphous silicon (a-Si) metal-oxide-nitride-oxide-silicon (MONOS) or metal-aluminum oxide-silicon (MAS) memory cell structure with one time programmable (OTP) function. But it would be recognized that the invention has a much broader range of applicability. For example, the invention can be applied to a variety of devices such as dynamic random access memory devices, static random access memory devices, flash memory devices, and other memory devices including one time programmable function (capable of being written with data only one time), and a method of integrating the device three-dimensionally.

In a specific embodiment, the invention provides a semiconductor device having a-Si MONOS or MAS memory cell structures with OTP function. The device includes a substrate and a first dielectric layer on the substrate. The first dielectric layer being associated with a first surface. The device further includes one or more source or drain regions being embedded in the first dielectric layer. Each of the one or more source or drain regions includes an n-type a-Si layer, a diffusion barrier layer, and a conductive layer. The diffusion barrier layer overlies the conductive layer and the n-type a-Si layer is located on the diffusion barrier layer and associated with an second surface which is substantially co-planar with the first surface. Additionally, the device includes an intrinsic (i-type) a-Si layer overlying the first surface and the second surface, a p-type a-Si layer overlying the i-type a-Si layer, and a second dielectric layer overlying the p-type a-Si layer. Moreover, the device includes at least one control gate overlying the second dielectric layer. The control gate is associated with a drain region of the one or more source or drain regions. In one embodiment, the device further may include an optional conductive path formed between the drain region and the control gate by applying a certain voltage. In another embodiment, the device further includes no conductive path formed between the drain region and the control gate by applying a certain voltage.

In an alternative specific embodiment, the invention provides a method for making an a-Si MONOS or metal-aluminum oxide-silicon (MAS) memory cell structure with OTP function. The method includes providing a substrate, forming a first insulation layer on the substrate, and forming one or more source or drain regions on the first insulation layer. Each of the one or more source or drain regions is associated with a first surface and includes an n-type a-Si layer, a barrier layer, and a conductive layer. The n-type a-Si layer is located on the barrier layer and the barrier layer overlays the conductive layer. The first surface consists of n-type a-Si. The method further includes forming a second insulation layer on the first insulation layer. The second insulation layer is associated with a second surface which is substantially co-planar with the first surface. Additionally, the method includes forming an i-type a-Si layer overlying the first surface and the second surface, forming a p-type a-Si layer overlying the i-type a-Si layer, and forming a third insulation layer overlying the p-type a-Si layer. The method further includes forming a metal layer overlying the third insulation layer and forming one or more control gates by patterning the metal layer. Each of one or more control gates is associated with one source region and one drain region. Moreover, the method includes optionally applying a certain voltage between each of selected one or more control gates and the associated drain region to form a conductive path respectively.

In yet another specific embodiment, the p-type a-Si overlying the i-type a-Si layer is capable of forming a p-i-n diode junction at the n-type a-Si surface. This p-i-n diode junction can act as an access device for each memory bit with improved signal-to-noise ratio and reduced scaling limitations. In yet another specific embodiment, the combination of n-type a-Si source region, p-type a-Si channel layer, and next n-type a-Si drain region is capable of forming a thin-film-transistor (TFT). The TFT can act as an alternative access device for the memory cell. Additionally, the simplicity of the cell structure design with a layered charge trapping element provides an ability for the cell structures to be integrated in 3D. For example, the whole memory cell structure can be implemented in a cross-point memory architecture in which each memory storage element, within an ONO layer or an aluminum oxide layer, can be sandwiched between an array of orthogonal wordlines and bitlines. In one specific embodiment, an one time programmable memory cell may be formed by applying a certain pre-determined voltage between a control gate and an associated drain region to create a conductive path through the re-crystallization of the stacked a-Si layers and the insulation breakdown of the third insulation layer.

Many benefits can be achieved by way of the present invention over conventional techniques. According to certain embodiments, the present invention combines the advantages of high reliability of ONO layer or high-k aluminum oxide layer as a charge-trapping element, small geometric cell size using a p-i-n diode as the access device, simple layered structure for active layers capable of forming a conductive path for one-time programming, and low thermal budget for fabrication and dopant activation within temperature tolerated by the memory cell. In addition, the present invention provides an easy to use process that is compatible with conventional CMOS process technology without substantial modifications to conventional equipment and processes. In some embodiments, the method provides a process that meets the stackability and thermal budget constraint for 3D memory cell structure. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a semiconductor device having a memory cell and a method for making the device. Merely by way of example, the invention has been applied to an amorphous silicon (a-Si) metal-oxide-nitride-oxide-silicon (MONOS) or metal-aluminum oxide-silicon (MAS) memory cell structure with one time programmable (OTP) function. But it would be recognized that the invention has a much broader range of applicability. For example, the invention can be applied to a variety of devices such as dynamic random access memory devices, static random access memory devices, flash memory devices, and other memory devices including one time programmable function (capable of being written with data only one time), and a method of integrating the devices three-dimensionally.

As discuss above, various conventional techniques have been directed to memory cells with reduced sizes. According to one of the conventional techniques, memory cells are implemented with stacked gate structure. For example, a stack structure is programmed using one or more channel hot-electrons that pass through a source region and a channel region and is then erased by a Fowler-Norheim tunneling effect.

Unfortunately, stacked gate cell structures, being of two-dimensional array type, usually have a smaller memory capacity per unit area as the cell size scales down. One feasible solution is to stack three-dimensionally several layers of memory arrays on top of a Si substrate containing the CMOS support circuitry. According to various embodiments, the present invention provides three dimensional memory cell structures. For example, certain embodiments of the present invention provides an ability to fabricate stackable access device in the memory cell. This brings up an requirement to improve the design of memory cell structure that can fulfill one or more of the following attributes including, stacking ability, small geometry, low leakage current, bi-directional operable, easy integration into a low temperature backend CMOS flow, cost effectiveness, efficiency, etc. Accordingly, various embodiments of the present invention provide an amorphous silicon (a-Si) metal-oxide-nitride-oxide-semiconductor (MONOS) or metal-aluminum oxide-silicon (MAS) memory cell structure. It is to be understood that the term "a-Si MONOS" or "a-Si MAS" refers to a class of memory cell structures and is broadly defined. For example, an a-Si MONOS cell structure may be illustrated according to FIG. 1 below. In another example, the cell structure shown in FIG. 1 may includes an optional conductive path between the gate and drain region for one time programming. The same is applied to a-Si MAS cell structure with OTP function.

Figure 1:
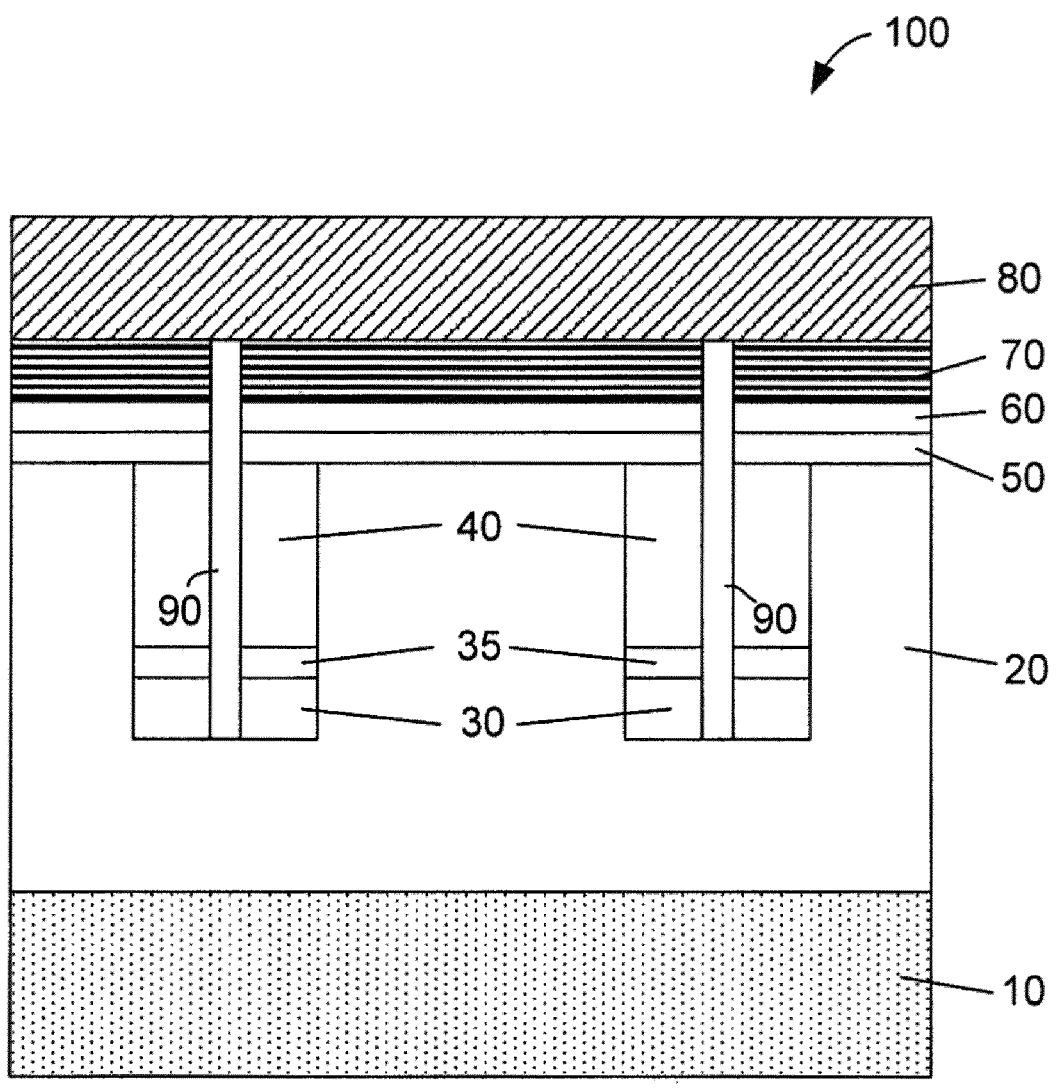
FIG. 1 is a simplified side-view diagram of an a-Si MONOS or MAS memory cell with OTP function according to an embodiment of the present invention.

FIG. 1 is a simplified diagram for a semiconductor device 100 with an a-Si MONOS or MAS memory cell structure with OTP function that is capable of being stacked three-dimensionally. This diagram is merely an example, which should not unduly limit the scope of the claims. One of ordinary skill in the art would recognize many variations, alternatives, and modifications. The device 100 includes following components:

1. Substrate 10;
2. First dielectric layer 20;
3. Conductive layer 30;
4. Diffusion barrier layer 35;
5. One or more n-type a-Si source or drain region 40;
6. i-type a-Si layer 50;
7. p-type a-Si layer 60;
8. Second dielectric layer 70;
9. Metal gate region 80; and
10. Optional OTP conductive path 90.

Although the above has been shown using a selected group of components for the device 100, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particular below.

In one embodiment, the substrate 10 is made of a semiconductor material. For example, the semiconductor material is silicon. In another example, the substrate 10 includes a plurality of semiconductor devices such as a-Si MONOS or MAS memory array with dielectric passivation. Each cell of the a-Si MONOS or MAS memory array may be or may be not includes a conductive path between the control gate and drain region capable of performing one time programming.

The first dielectric layer 20 is located on the substrate 10. In one embodiment, at least part of the first dielectric layer 20 consists of silicon dioxide formed through thermal oxidation process on a silicon substrate. In another embodiment, the dielectric layer 20 is silicon oxide deposited by high-density-plasma (HDP) assisted chemical vapor deposition or is TEOS deposited silicon oxide.

There are one or more confined regions embedded in the first dielectric layer 20. Each of these confined region contains a conductive layer, a diffusion barrier layer, and a semiconductor source or drain region. In an exemplar confined region as shown in FIG. 1, the conductive layer 30 is located at the bottom and the diffusion barrier layer 35 overlays the conductive layer 30, followed by a n-type a-Si layer 40. The n-type a-Si layer 40 has a surface co-planar with the surface of the first dielectric layer 20. The n-type a-Si layer 40 is capable of forming a source or drain region for the device 100. The n-type source or drain region 40 is conductively connected to the conductive layer 30 through the diffusion barrier layer 35. The conductive layer 30 is capable of coupling electrically with the memory bitlines (not shown in FIG. 1) to perform programming or erasing function for the memory cell. In one embodiment, the conductive layer 30 is a material containing metal or metal alloy material. For example, the material is titanium silicide. In another embodiment, the diffusion barrier layer 35 is titanium nitride.

Referring to FIG. 1, the n-type a-Si source or drain region 40 contains hydrogen-free amorphous silicon which is located at the top part within the confined region embedded in the first dielectric region 20. In one embodiment, the amorphous silicon is doped with n-type dopants (e.g., As, P, etc) to be conductive with electrons as its majority carrier. As seen in FIG. 1, in another embodiment, the n-type a-Si source or drain region 40 has a co-planar surface with the first dielectric layer 20.

Referring again to FIG. 1, the i-type a-Si layer 50 is located on the co-planar surface of the n-type a-Si source or drain region 40 and the first dielectric layer 20. The i-type a-Si layer 50 is an intrinsic semiconductor without impurity doping. In one embodiment, the i-type a-Si layer 50 is at least partially in direct contact with the n-type a-Si source or drain region 40. Additionally, the p-type a-Si layer 60 is located on the i-type a-Si layer 50. In one example, the p-type a-Si layer is doped with p-type dopants (e.g., B, Ga, etc) with holes as its majority carrier. Referring to FIG. 1, in another embodiment, p-type a-Si layer 60 and i-type a-Si layer 50 overlying the confined n-type a-Si source or drain region 40 form an a-Si p-i-n diode junction in the device 100. In yet another embodiment, the p-type a-Si layer 60 located over two neighboring n-type a-Si source or drain regions 40 is capable of forming a p-channel thin-film transistor (TFT). Either the a-Si p-i-n diode junction or p-channel TFT can be utilized as a memory access device for the device 100. In further another embodiment, the a-Si layers is capable of being re-crystallized through a nucleation process induced dopant directional diffusion enhanced by applying a sufficiently high drain voltage (between the n-type a-Si drain region and a gate electrode).

Referring to FIG. 1, a second dielectric layer 70 is located on the p-type a-Si layer 60. In a specific embodiment, the second dielectric layer 70 may be an ONO layer. The ONO layer includes a bottom oxide layer overlying the p-type a-Si layer 60, followed by a nitride layer overlying the bottom oxide layer, and an upper oxide layer overlying the nitride layer. For example, the bottom oxide layer and the upper oxide layer are made of atomic-layer deposited silicon dioxide. The nitride layer is made of atomic-layer deposited silicon nitride capable of trapping charges for memory storage. In another embodiment, the upper oxide layer is a blocking dielectric or gate insulation layer for blocking the charge leakage out of the charge trapping nitride layer. The ONO layer can be modified to optimize certain device design requirements. For example, the composition in silicon nitride layer and the thickness of the tunnel oxide and blocking dielectric can be adjusted to provide enhanced performance for the memory device. In another example, the charge amount trapped in the silicon nitride layer may be fine tuned and controlled to store 4 or more bits per cell.

In an alternative embodiment, the second dielectric layer 70 may be an aluminum oxide layer, In one specific embodiment, the aluminum oxide layer acts as the charge trapping dielectric. In another specific embodiment, the aluminum oxide layer acts as blocking dielectric setting a large barrier height to reduce probability of the charge leaking into the gate region of the memory cell. For example, the use of an aluminum oxide blocking dielectric allows for a comparatively simple metal gate integration with reduced access time. In yet another embodiment, an additional dielectric barrier layer may be located between the p-type a-Si layer 60 and the aluminum oxide layer, playing a role as a tunnel barrier through which the hot carriers is injected from the drain region by the programming electric field in p-i-n junction. For example, the dielectric barrier layer can be silicon oxide. In certain embodiments, using aluminum oxide layer effectively reduces the total equivalent oxide thickness and offers a large design space for the tunnel barrier to meet certain device design requirements. For example, the thickness adjustment of the tunnel barrier and aluminum oxide layer provides a good control of the retention time and programming/erasing characteristics for the device 100. In another example, the charge amount trapped in the high-k aluminum oxide layer may be fine tuned and controlled to store 4 or more bits per cell.

Referring back to FIG. 1, the device 100 further includes at least one metal gate region 80 as a control gate. The metal gate region 80 is formed by patterning a metal layer which is formed overlying the second dielectric layer 70. The patterned metal gate region 80 is located at least over one confined n-type a-Si source or drain region 40 where a p-i-n a-Si diode junction is formed. The pattern geometry of the metal gate region 80 is not specifically shown in FIG. 1, which is merely an example and one of ordinary skill in the art would recognize many variations, alternatives, and modifications of the metal gate regions 80 as well as their interconnections. For example, the metal gate region 80 can be electrically coupled to the memory array wordlines (not shown) which may be orthogonal to the memory bitlines coupled to the conductive layer 30. In one embodiment, the metal gate region 80 as a control gate of the memory cell can be made of a material with high work function to suppress the parasitic gate erase current. In one example, the metal gate region 80 includes titanium material. In another example, the metal gate region 80 includes aluminum material.

In another alternative embodiment, the second dielectric layer 70 is capable of being made conductive after applying a pre-determined high drain voltage between the drain region 40 and the metal gate region 80 to cause the insulation breakage. With a small voltage applied at memory cell bitline, an energy difference between the valence electron band and a Fermi level in the layer of metal gate region 80 and the p-type a-Si layer is generated. In the vicinity of their interfaces with the second dielectric layer 70, electrons and holes are accumulated respectively. When the applied voltage reaches a pre-determined value or larger, tunnel effects start and electron-hole recombination (RC) occurs, generating and transferring heat into the second insulation layer. The RC heat causes the insulation breakdown of either the ONO layer or aluminum oxide layer. As described elsewhere in the specification, this same high drain voltage is also capable of causing re-crystallization of amorphous silicon. The re-crystallization of the doped amorphous silicon material occurs through a nucleation induced by the dopants directional inter-diffusion enhanced by an external electric field therein. The crystallized regions within the amorphous silicon layers including n-type a-Si layer 40, i-type a-Si layer 50, and p-type a-Si layer 60 become highly conductive for the carriers. In other words, a conductive path 90 between the n-type drain region 40 and metal gate region 80 can be formed, as shown in FIG. 1. Applying the high drain voltage is an optional step to form a so-called one time programming (OTP) cell. In one specific embodiment, the device 100 having such an a-Si MONOS or MAS cell structure can be selected to form the conductive path 90 between its drain region 40 and gate region 80. In another specific embodiment, the device 100 having such an a-Si MONOS or MAS cell structure can be selected to not form such a conductive path between its drain region 40 and gate region 80. Therefore, data can be stored or successfully written by the conduction or non-conduction state between the n-type a-Si drain region 40 and the metal gate region 80. In order to read out the data stored in the memory cell as described, for example, the conduction or non-conduction state between the wordline and the bitline connected to the memory cell to be read out is checked to obtain the stored data. In other words, the device 100 as shown in FIG. 1 represent an embodiment of an a-Si MONOS or MAS memory cell with OTP function.

According to an embodiment of the present invention, the device 100 with an a-Si MONOS or MAS memory cell structure with OTP function can be repeated laterally to form a memory array. The memory array further can be passivated with an inter-layer dielectrics with a plurality of metal interconnects and/or contacts to the gate, source or drain regions. In another embodiment, the passivation layer can be further planarized to form a substrate for stacking a plurality of the devices 100 again. In yet another embodiment, the present invention provides an a-Si MONOS or MAS memory cell structure with OTP function that can be integrated in multiple layers to form a three-dimensional memory array.

Figure 2:
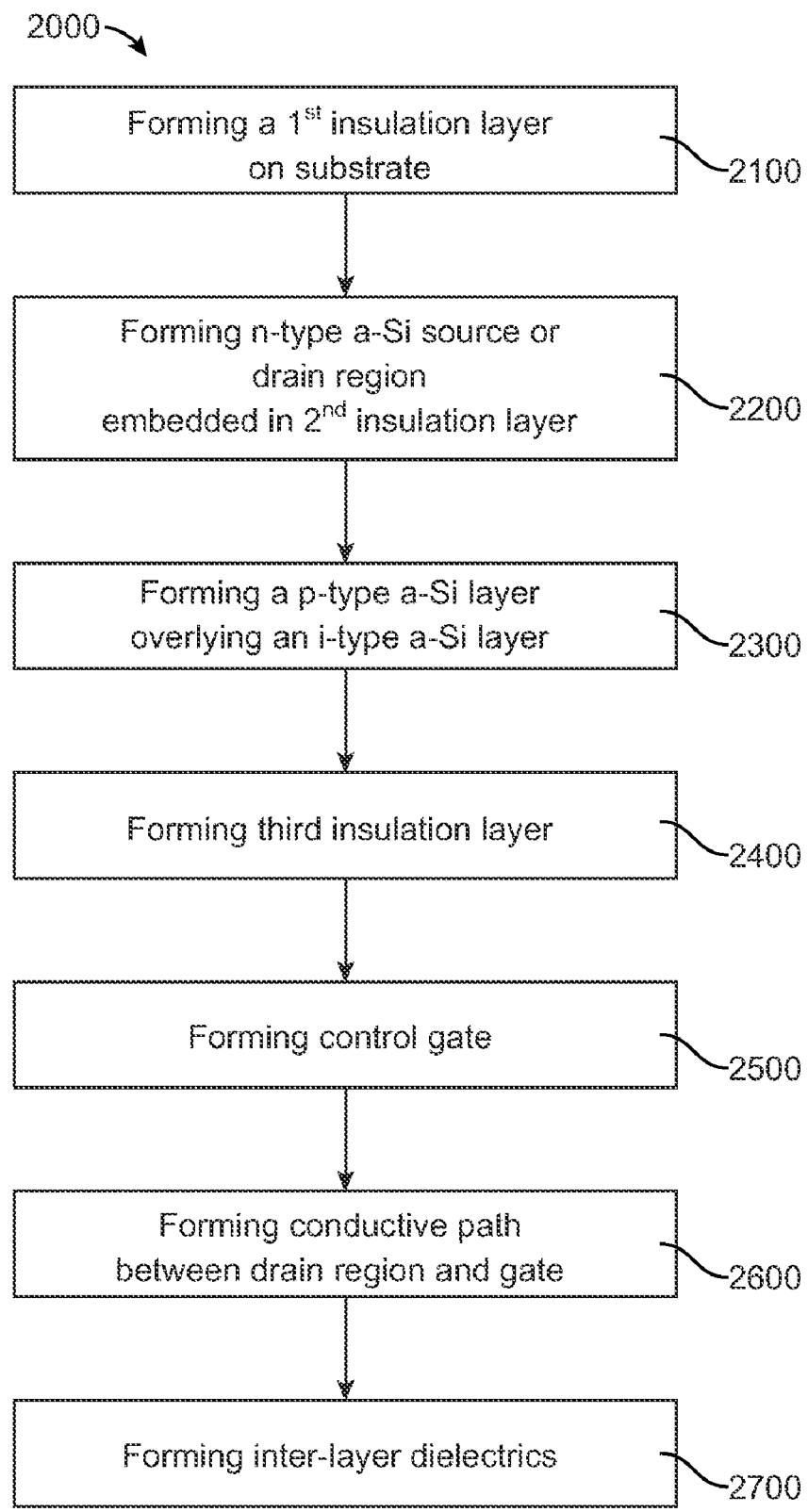
FIG. 2 is a simplified diagram showing a method of manufacturing a-Si MONOS or MAS memory cell structure with OTP function according to an embodiment of the present invention.

FIG. 2 is a simplified diagram showing a method for manufacturing an a-Si MONOS or MAS memory cell structure with OTP function according to an embodiment of the present invention. This diagram is merely an example, which should not unduly limit the scope of the claims herein. The method 2000 includes the following processes:

1. Process 2100 for forming first insulation layer on a substrate;
2. Process 2200 for forming n-type a-Si source or drain region embedded in second insulation layer;
3. Process 2300 for forming p-type a-Si layer overlying an i-type a-Si layer;
4. Process 2400 for forming third insulation layer;
5. Process 2500 for forming metal control gate;
6. Process 2600 for selectively forming a conductive path between the drain region and metal control gate; and
7. Process 2700 for forming inter-layer dielectrics.

The above sequence of processes provides a method according to an embodiment of the present invention. Other alternatives can also be provided where processes are added, one or more processes are removed, or one or more processes are provided in a different sequence without departing from the scope of the claims herein. For example, the semiconductor device with an a-Si MONOS or MAS memory cell structure with OTP function made by the method 2000 is the device 100. Further details of the present invention can be found throughout the present specification and more particularly below.

Figure 3A:
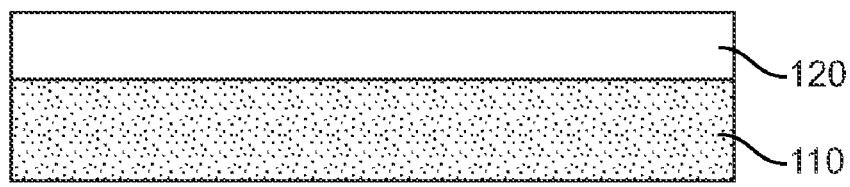
FIG. 3A is a simplified diagram showing a method of forming a first insulation layer on a substrate for making an a-Si MONOS or MAS memory cell structure with OTP function according to an embodiment of the present invention.

At the process 2100, an insulation layer is formed on a substrate. FIG. 3A shows a simplified method for forming an insulation layer for manufacturing a semiconductor device with a-Si MONOS or MAS memory cell structures with OTP function according to an embodiment of the present invention. This diagram is merely an example, which should not unduly limit the scope of the claims. One of ordinary skill in the art would recognize many variations, alternatives, and modifications.

As shown in FIG. 3A, a starting substrate 110 is provided. For example, the substrate 110 includes silicon. In another example, the substrate 110 includes a plurality of semiconductor devices including a plurality of CMOS memory devices embedded in inter-layer dielectrics with passivation. On the substrate 110, a first insulation layer 120 is formed. In one embodiment, the first insulation layer 120 includes silicon dioxide. For example, the silicon dioxide is formed by thermal oxidation process. In another example, the silicon dioxide layer is deposited by using high-density plasma chemical vapor deposition (HDP-CVD) technique.

Referring to FIG. 2 at process 2200, one or more n-type a-Si source or drain regions are formed. FIGS. 3B, 3C, 3D, and 3E show a simplified method for forming one n-type a-Si source or drain region for manufacturing a semiconductor device with a-Si MONOS or MAS memory cell structures with OTP function according to an embodiment of the present invention. These diagrams are merely examples, which should not unduly limit the scope of the claims. One of ordinary skill in the art would recognize many variations, alternatives, and modifications. For example, the process 2200 can be implemented to make the device 100.

Figure 3B:
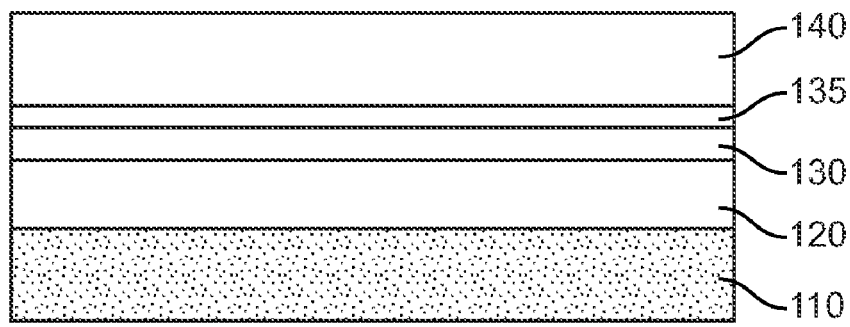
FIG. 3B is a simplified diagram showing a method of forming a conductive layer, a diffusion barrier layer, and an n-type a-Si layer sequentially for making an a-Si MONOS or MAS memory cell structure with OTP function according to an embodiment of the present invention.

As shown in FIG. 3B, on the first insulation layer 120 a conductive layer 130, a diffusion barrier layer 135, and an n-type a-Si layer 140 are formed sequentially. In one embodiment, the conductive layer 130 is made of a metal silicide material. The metal silicide is capable of forming a contact pad for electric coupling. For example, the conductive layer 130 can be electrically coupled with memory array bitlines (not shown) embedded in the first insulation layer 120 along a certain direction. In another example, the conductive layer 130 is titanium silicide ($TiSi_2$). In another embodiment, the $TiSi_2$ layer can be formed by various deposition techniques including evaporation, sputtering or CVD. For example, $TiSi_2$ layer is formed through thermal CVD using gas mixture of $SiH_4$ and $TiCl_4$ etc followed by a thermal annealing at 600-800° C.

In yet another embodiment, to reduce the metal inter-diffusion issue, a diffusion barrier layer 135 is deposited overlying the conductive layer 130 prior the formation of semiconductor layer. For example, the diffusion barrier layer 135 is made of titanium nitride (TiN) material. In another example, TiN layer is deposited with low-pressure chemical vapor deposition (LPCVD) or physical vapor deposition (PVD). Referring again to FIG. 3B, an n-type a-Si layer 140 is formed on the diffusion barrier layer 135. In still another embodiment, the n-type a-Si layer 140 is deposited through a low temperature (<400° C.) plasma-enhanced CVD with flowing of $SiH_4/PH_3/H_2$ gas mixture, wherein phosphorus is the n-type dopant impurity. Other alternative methods such as LPCVD and atomic layer deposition (ALD) techniques can be used to form the n-type a-Si layer 140. Obviously, one of ordinary skill in the art would recognize many other alternatives of the n-type a-Si formation including its dopant.

Figure 3C:
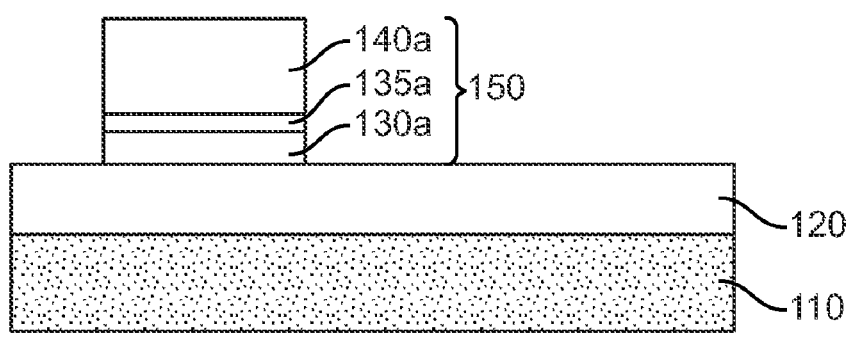
FIG. 3C is a simplified diagram showing a method of forming a source or drain region for making an a-Si MONOS or MAS memory cell structure with OTP function according to an embodiment of the present invention.

Still at process 2200, referring to FIG. 3C, according to an embodiment of the present invention, patterning and etching are performed with the sequential layers of 130, 135, and 140. In one embodiment, the patterning is performed with the application of a photoresist layer followed by the UV light exposure under a patterned photo mask. Developing the photoresist layer and strip-cleaning the exposed resist material lead to a surface consisting of partially revealed n-type a-Si layer 140 and one or more confined regions that are still covered by the resist layer. Furthermore, plasma etching is performed to remove the layers of 130, 135, and 140 that are unmasked until the first insulation layer 120 is revealed. The etching process is anisotropic so that the regions covered by the resist layer pattern are remained. After the resist layer is removed, one or more confined regions 150 are formed as shown in FIG. 3C. In one embodiment, each of the one or more confined regions 150 includes confined portions of n-type a-Si layer 140a, a diffusion barrier layer 135a, and a conductive layer 130a. The confined n-type a-Si layer 140a is located on the confined diffusion barrier layer 135a which overlays the confined conductive layer 130a.

Figure 3D:
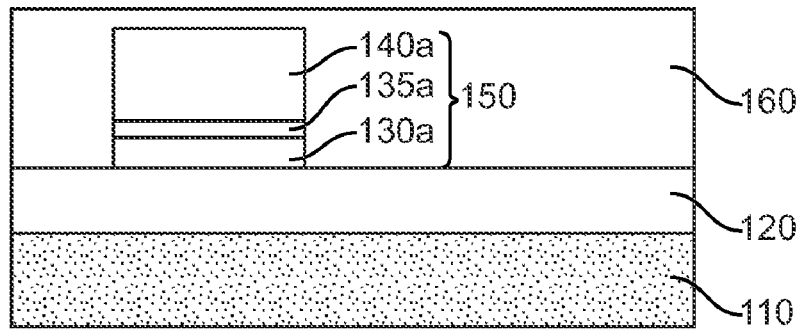
FIG. 3D is a simplified diagram showing a method of forming a second insulation layer around the source or drain region for making an a-Si MONOS or MAS memory cell structure with OTP function according to an embodiment of the present invention.

Additionally at process 2200, a second insulation layer 160 is added to completely cover the formed one or more confined regions 150 and the exposed area of the first insulation layer 120, as shown in FIG. 3D. In one embodiment, the second insulation layer 160 includes silicon oxide. For example, the silicon oxide is deposited with high-density-plasma (HDP) Chemical Vapor Deposition. In another example, the silicon oxide is tetraethyl orthosilicate TEOS deposited silicon oxide.

Figure 3E:
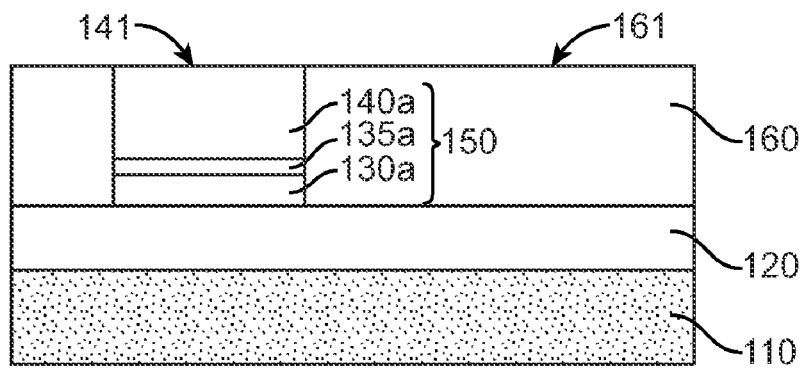
FIG. 3E is a simplified diagram showing a method of forming a co-planar surface of the source or drain region and the second insulation layer for making an a-Si MONOS or MAS memory cell structure with OTP function according to an embodiment of the present invention.

Referring to FIG. 3E, still at process 2200, a chemical-mechanical planarization (CMP) process is performed to remove extra amount of the second insulation layer 160 until the n-type a-Si layer 140a in the confined regions 150 is revealed and a co-planarized surface is formed. The CMP planarized surface includes at least partially the first surface 141 of the n-type a-Si layer in the regions 140a and partially the second surface 161 of the second insulation layer 160. In another embodiment, combination of a CMP process and a dry etching process or the dry etching process alone can be used to remove extra amount of the second insulation layer 160. In yet another embodiment of the present invention, the second insulation layer 160 is deposited around the confined regions 150 (as shown in FIG. 3C) until the second surface 161 of the second insulation layer 160 is a substantially co-planar with the first surface 141 of the n-type a-Si in regions 140a. The n-type a-Si layer 140a within each of the one or more confined regions 150 is embedded in the second insulation layer 150 with a co-planar surface and capable of forming a source or drain region of a memory device. For example, the memory device is the device 100.

Figure 3F:
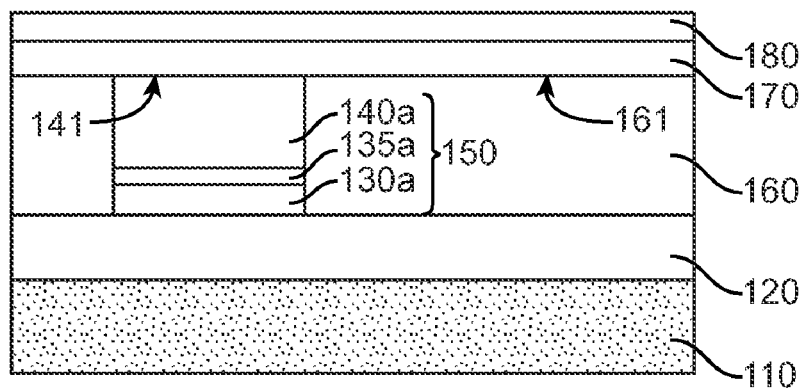
FIG. 3F is a simplified diagram showing a method of forming a p-i-n diode junction for making an a-Si MONOS or MAS memory cell structure with OTP function according to an embodiment of the present invention.

Referring back to FIG. 2 at process 2300, a sequential layer of i-type a-Si and p-type a-Si is formed. FIG. 3F shows a simplified method for forming a p-type a-Si layer overlying an i-type a-Si layer for manufacturing a semiconductor device with a-Si MONOS or MAS memory cell structures with OTP function according to an embodiment of the present invention. This diagram is merely an example, which should not unduly limit the scope of the claims. One of ordinary skill in the art would recognize many variations, alternatives, and modifications.

As shown in FIG. 3F, an intrinsic or undoped (i.e., the i-type) a-Si layer 170 is formed overlying the surface 141 of the n-type a-Si layer 140a in the confined region 150 and the surface 161 of the second insulation layer 160. In one embodiment, the i-type a-Si layer 170 is at least partially in contact with the surface 141 of the n-type a-Si layer 140a in the confined regions 150. In another embodiment, the i-type a-Si layer 170 is deposited through a low temperature (<450° C.) plasma enhanced CVD with flowing of $SiH_4/H_2$ gas mixture. In another example, the i-type a-Si layer 170 is formed by depositing amorphous silicon using $Si_2H_6$ with LPCVD under 450° C. Other alternative method can be used, such as using $SiH_4$ or $Si_2H_6$ with ALD method.

Additionally at process 2300, a p-type a-Si layer 180 is deposited overlying the i-type a-Si layer 170. For example, the p-type a-Si layer 180 is deposited through a low temperature (<450° C.) plasma-enhanced CVD process with a flowing of $SiH_4/BF_3/H_2$ gas mixture. Other alternative methods such as LPCVD and ALD techniques can be used to form the p-type a-Si layer 180. Of course, one of ordinary skill in the art would recognize many other alternatives of the p-type a-Si formation including its dopant. In one specific embodiment, over the confined n-type a-Si layer 140a there exists a sequential layer of i-type a-Si and p-type a-Si, which is capable of forming an a-Si p-i-n diode junction. The a-Si p-i-n diode junction can be used as an access device for a memory cell. In another specific embodiment, the confined n-type a-Si layer 140a in one of confined region 150 forms a source region and the confined n-type a-Si layer 140a in a neighboring region 150 forms a drain region. Over both of the regions 150 the p-type a-Si layer 180 on the i-type a-Si layer 170 forms a thin-film-transistor channel connecting the n-type source region to the n-type drain region. Such an architecture including an a-Si p-channel thin-film-transistor, according to an embodiment of the invention, can also functions as an access device for a memory cell.

Figure 3G:
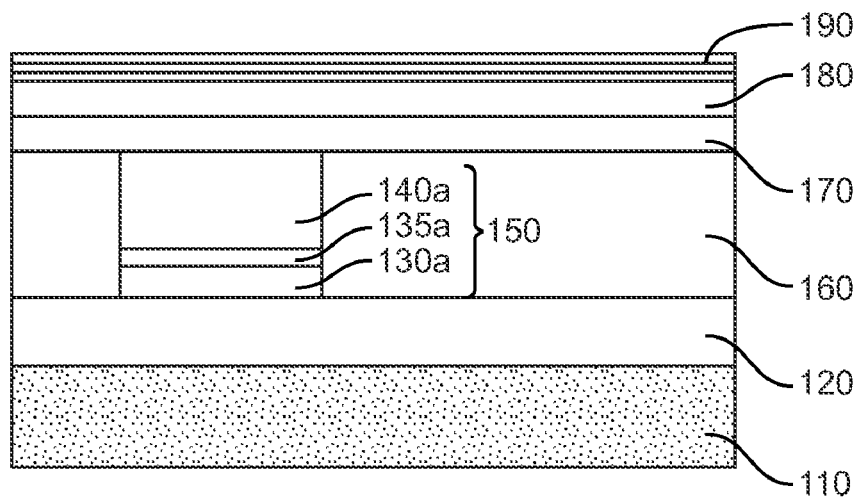
FIG. 3G is a simplified diagram showing a method of forming a third insulation layer for making an a-Si MONOS or MAS memory cell structure with OTP function according to an embodiment of the present invention.

Referring again to FIG. 2 at process 2400, a third insulation layer is formed. FIG. 3G shows a simplified method for forming a charge-trapping insulation layer for manufacturing a semiconductor device with a-Si MONOS or MAS memory cell structures with OTP function according to an embodiment of the present invention. This diagram is merely an example, which should not unduly limit the scope of the claims. One of ordinary skill in the art would recognize many variations, alternatives, and modifications.

Referring to FIG. 3G, the third insulation layer 190 is formed overlying the p-type a-Si layer 180. In a specific embodiment, the third insulation layer comprises a nitride layer sandwiched by a bottom oxide layer and an upper oxide layer. For example, the nitride layer is silicon nitride deposited by ALD technique. In another example, the nitride is a silicon-rich nitride. The bottom oxide layer is a tunnel oxide separating the nitride layer from the p-type a-Si layer 180. The upper oxide layer is a blocking oxide or gate insulation layer, setting a high barrier for the retention of the charge in the nitride layer. In one example, both the bottom oxide layer and upper oxide layer are made of silicon dioxide. In another example, the silicon dioxide is grown by ALD technique. In one embodiment, the upper oxide layer may be thicker than the bottom oxide layer.

Referring again to FIG. 3G, in another specific embodiment, the third insulation layer 190 comprises an aluminum oxide layer with high dielectric constant. In one embodiment, the aluminum oxide layer acts as both a charge trapping dielectric and a blocking or control gate dielectric. For example, the aluminum oxide layer is deposited using a low-temperature (~100° C.) ALD technique followed by thermal annealing. In certain embodiments, a bottom tunnel barrier layer is added between the aluminum oxide layer and the p-type a-Si layer 180, where the high mobility hot carriers can be injected into the aluminum oxide layer from the n-type a-Si drain region 140a by the programming electric field. In one example, the tunnel barrier layer can be silicon dioxide. In another example, the silicon dioxide is formed by atomic-layer-deposition. In yet another embodiment, using aluminum oxide as charge trapping element effectively reduce equivalent total oxide thickness (EOT), thus reducing the access time. As EOT is reduced, the thickness of the tunnel barrier layer can be adjusted to raise the barrier height for achieving a better charge retention time.

Figure 3H:
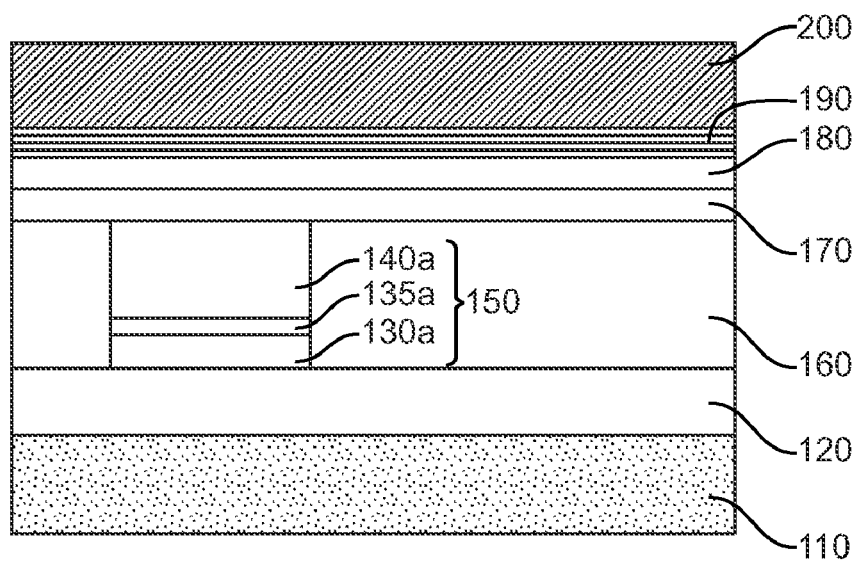
FIG. 3H is a simplified diagram showing a method of forming a metal control gate on the third insulation layer for making an a-Si MONOS or MAS memory cell structure with OTP function according to an embodiment of the present invention.

At process 2500, a metal control gate is formed. FIG. 3H shows a simplified method for forming a metal control gate for manufacturing a semiconductor device having a-Si MONOS or MAS memory cell structures with OTP function according to an embodiment of the present invention. This diagram is merely an example, which should not unduly limit the scope of the claims. One of ordinary skill in the art would recognize many variations, alternatives, and modifications. For example, the process 2500 of the invented method is implemented to make the metal control gate for the device 100.

As shown in FIG. 3H, a metal layer 200 is deposited overlying the third insulation layer 190. The metal layer 200 includes a material with a high work function. In one example, the metal layer 200 is made of aluminum material. In another example, the metal layer 200 includes titanium material. The metal deposition can be performed by various techniques including evaporation, sputtering, and electro-chemical deposition (ECD).

According to an embodiment of the present invention, a control gate can be formed by patterning the metal layer 200 located on the third insulation layer 190 over the a-Si p-i-n diode junction formed at process 2300. In another embodiment, the patterned control gate is positioned over a p-channel TFT formed alternatively at process 2300. In still another embodiment, dual metal gates can be formed within each memory cell. The patterning and etching processes for forming each of the control gate include applying photoresist layer, masking, exposing light, developing resist, striping exposed resist residue, metal etching and resist layer removing, etc.

In another embodiment, each of the patterned control gate can be electrically coupled with memory array wordlines. The memory array wordlines may be configured to be orthogonal to the directions of bitlines of the memory array thereof. Although the detail pattern geometry of the control gate is not explicitly illustrated in FIG. 3H, one of ordinary skilled in the art would recognize many variations, alternatives, and modifications of the gate architectures which should not unduly limit the scope of the claims. At the end of the process 2500, the formation of the control gate completes the formation of the a-Si MONOS or MAS memory cell structure with OTP function. Furthermore, according to certain embodiments of the invention, array of devices 100, or a memory array, can be made laterally by repeating the method 2000 including sequential processes from the process 2100 to the process 2500.

Figure 3I:
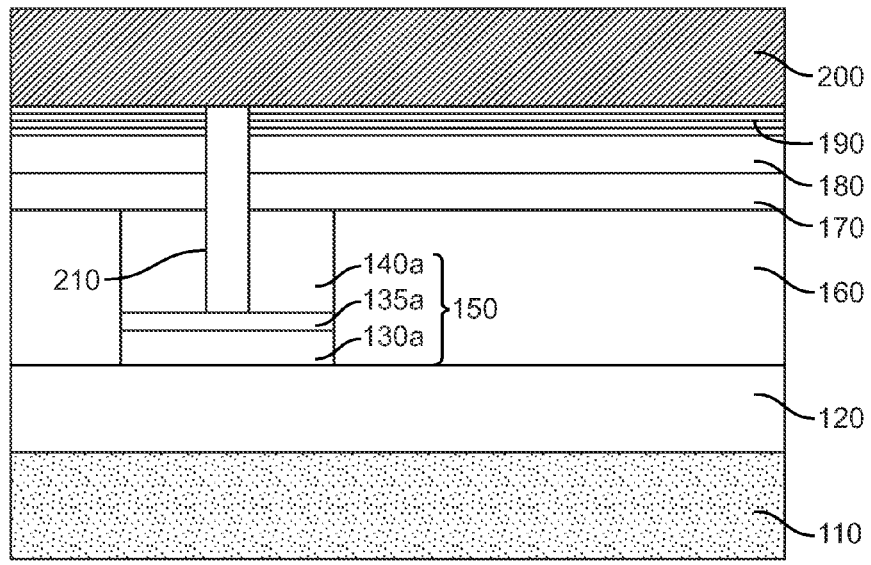
FIG. 3I is a simplified diagram showing a method of forming a conductive path between the metal control gate and an associated drain region for making an a-Si MONOS or MAS memory cell structure with OTP function according to an embodiment of the present invention.

Referring back to FIG. 2 at process 2600, a conductive path between the drain region and metal gate region is formed. FIG. 3I shows a simplified method for forming a conductive path between the drain region and metal gate region for manufacturing a semiconductor device having a-Si MONOS or MAS memory cell structures with OTP function according to an embodiment of the present invention. This diagram is merely an example, which should not unduly limit the scope of the claims. One of ordinary skill in the art would recognize many variations, alternatives, and modifications.

For example, the process 2600 of the invented method is selectively implemented to form a conductive path 210 between the drain region 140a and metal gate region 200 for the device 100, as shown in FIG. 3I. In a specific embodiment, for the selected cell 100, a pre-determined high drain voltage is applied to the n-type a-Si drain region 140a (assuming the source region is grounded) and a bit voltage is applied to the metal gate 200. The energy difference between a valence electron band level and Fermi level in the a-Si layer and metal gate is generated. In the vicinity of the interface between a-Si layer and metal layer and the charge-trapping insulation layer a quantum well state is formed respectively with respect to the holes and electrons. When the voltage difference between the drain voltage and the bit voltage becomes a predetermined value or larger, electrons pass through a barrier formed by the third insulation layer 190 by a tunnel effect and recombine with the holes. This process releases heat which is directly transferred to the third insulation layer 190 and causes the insulation breakdown. In another specific embodiment, the same high drain voltage generate a strong electric field within the a-Si layers (from the n-type a-Si layer 140a to p-type a-Si layer 180). The dopants in the a-Si layers (such as B, P, or As etc.) is driven by the electric field to inter-diffuse along the field direction. These directional inter-diffused dopants serve as nucleation seeds for the crystallization of amorphous silicon. Combining the re-crystallization of amorphous silicon layers (140a, 170, and 180) and insulation breakdown in the third insulation layer 190, the conductive path 210 is formed between the n-type a-Si drain region 140a and the metal control gate 200.

In one embodiment, apply a pre-determined high drain voltage is a part of writing the data into the cell, i.e., programming for only one time or storing data for read only. For a thin charge trapping insulation layer of a few nanometer, the breakdown voltage may be around 10 volt. As the device scaling down, the programming voltage may be further reduced. In one specific embodiment, process 2600 is performed to an selected a-Si MONOS or MAS memory cell to form a conductive path between its drain region and gate region. In another specific embodiment, another selected a-Si MONOS or MAS memory cell is skipped process 2600 to not form such a conductive path between its drain region and gate region. Therefore, the data can be stored or successfully written in the memory array by the conduction or non-conduction between the n-type a-Si drain region and the metal gate region of corresponding memory cell. In order to read out the data stored in the memory array thereof, for example, the conduction or non-conduction between the wordlines and the bitlines connected to the memory array to be read out is checked to thereby obtained the read data.

Figure 3J:
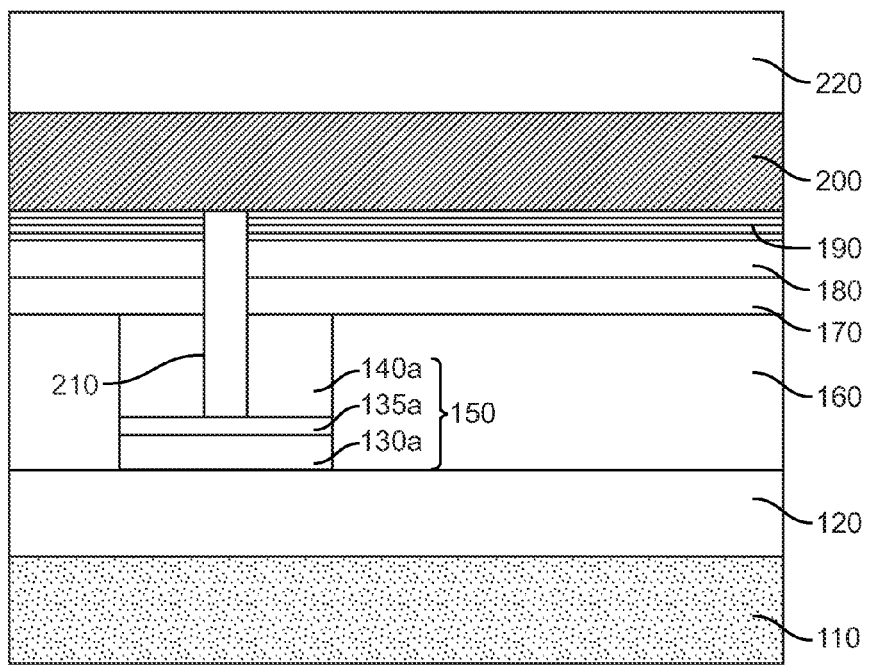
FIG. 3J is a simplified diagram showing a method of forming an inter-layer dielectrics for making three-dimensional a-Si MONOS or MAS memory cell structure with OTP function according to an embodiment of the present invention.

Referring back to FIG. 2 at process 2700, an inter-layer dielectrics is formed. FIG. 3J shows a simplified method of forming an inter-layer dielectrics 220 covering a device with a-Si MONOS or MAS memory cell structures with OTP function formed at the end of the process 2600. This diagram is merely an example, which should not unduly limit the scope of the claims. One of ordinary skill in the art would recognize many variations, alternatives, and modifications. For example, a plurality of devices having a-Si MONOS or MAS memory cell structures with OTP function can be formed at the end of the process 2600 prior to the formation of the inter-layer dielectrics 220. Additionally, metal interconnects (not shown) can be embedded in the inter-layer dielectrics 220 for either bitlines or wordlines of the memory arrays. In another specific embodiment, the a-Si MONOS or MAS memory cell structure with OTP function formed through process 2100 to 2700 is three-dimensional (3D) stackable. For example, the inter-layer dielectrics may be planarized by a CMP or an etch back process The planarized surface of the dielectrics can be used as a new substrate. Then the method 2000 can be repeated to form another layer of memory cell arrays.

As shown in FIG. 3I, in a specific embodiment, the invention provides a device having an a-Si MONOS or MAS memory cell structure with OTP function. The device includes a substrate, a dielectric layer on the substrate, and one or more source or drain regions being embedded in the first dielectric layer. Each of the one or more source or drain regions includes an n-type a-Si layer, a diffusion barrier layer, and a conductive layer. The n-type a-Si layer, which has a co-planar surface with the first dielectric layer, is located on the diffusion barrier layer. The diffusion barrier layer overlays the conductive layer. Additionally, the device includes an intrinsic type (i-type) a-Si layer overlying the co-planar surface of the n-type a-Si layer and the first dielectric layer. Moreover, the device includes a p-type a-Si layer overlying the i-type a-Si layer. The device further includes a second dielectric layer overlying the p-type a-Si layer and at least one control gate overlying the second dielectric layer. The control gate is associated with a drain region of the one or more source or drain regions. Furthermore, the device includes an optional conductive path formed between the control gate and the associated drain region by applying a certain voltage.

The processes described above for manufacturing a semiconductor device with a-Si MONOS or MAS memory cell structures with OTP function are merely examples which should not unduly limit the scope of the claims herein. There can be many alternatives, modifications, and variations for an ordinary skill in the art. For example, some of the processes may be expanded and/or combined. Other processes may be inserted to those mentioned above. According to a specific embodiment, the method 2000 straightforwardly provides a two-dimensional array of memory cells having the same structure of device 100. According to another specific embodiment, the method 2000 can be repeated to stack the memory cell structure in multi-layers, so that a 3D arrays of memory cell structures can be manufactured. The simplicity of the formation of n-type a-Si source or drain regions, an a-Si p-i-n diode junction or a p-channel TFT, and an ONO layer or aluminum oxide layer for charge trapping followed by a metal control gate provides easy 3D stackability. For example, the device 100 having a-Si MONOS or MAS memory cell structure with OTP function can be embedded in larger chips three-dimensionally with increased memory density per unit area in the vertical direction.

The present invention has various advantages. Some embodiments of the present invention provide an a-Si MONOS memory cell that is capable for 3D stacking Certain embodiments of the present invention provide an a-Si p-i-n diode junction in the memory cell as the memory access device. For example, the a-Si p-i-n diode junction is formed with low temperature (<450° C.) CVD process. Some embodiments also provide one time programmable function for the memory cell through the optional formation of a conductive path between the drain and gate. A specific embodiment of the invention provides a method of selectively forming such a conductive path through the re-crystallization of a-Si layer and insulation breakdown induced by an applied drain voltage at a predetermined value or more. Both a-Si junction and OTP path formation processes meet the stackability and thermal budget constraints for the 3D memory cells. Some embodiments of the present invention can reduce transistor leakage current and improve the charge retention time for the memory cell. Certain embodiments of the present invention provide a simple method for making 3D memory cells using processes that are fully compatible with established CMOS technology.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device having amorphous silicon (a-Si) metal-oxide-nitride-oxide-semiconductor (MONOS) or metal-aluminum oxide-silicon (MAS) memory cell structures with one-time programmable (OTP) function, the device comprising:
   a substrate;
   a first dielectric layer on the substrate, the first dielectric layer being associated with a first surface;
   one or more source or drain regions being embedded in the first dielectric layer, each of the one or more source or drain regions including an n-type a-Si layer, a diffusion barrier layer, and a conductive layer, the diffusion barrier layer overlying the conductive layer, the n-type a-Si layer being located on the diffusion barrier layer and associated with a second surface, the second surface being substantially co-planar with the first surface;
   an intrinsic (i-type) a-Si layer overlying the first surface and the second surface;
   a p-type a-Si layer overlying the i-type a-Si layer;
   a second dielectric layer overlying the p-type a-Si layer;
   at least one control gate overlying the second dielectric layer, the at least one control gate being associated with a drain region of the one or more source or drain regions; and
   a conductive path formed between the at least one control gate and the associated drain region by applying a certain voltage.

2. The device of claim 1 wherein the first dielectric layer comprises silicon oxide.

3. The device of claim 1 wherein the conductive layer is metal silicide comprising TiSi2.

4. The device of claim 3 wherein the metal silicide layer is capable of coupling with memory array bitlines electrically.

5. The device of claim 1 wherein the diffusion barrier layer is metal-nitride comprising TiN.

6. The device of claim 1 wherein the p-type a-Si layer overlying the i-type a-Si layer is capable of forming an amorphous silicon p-i-n diode junction at the second surface.

7. The device of claim 1 wherein the second dielectric layer on the p-type a-Si layer comprises an ONO (oxide-nitride-oxide) layer or an aluminum oxide layer grown by atomic-layer deposition (ALD) technique.

8. The device of claim 7 wherein the ONO layer comprises an silicon nitride layer sandwiched by an upper silicon dioxide block layer and a bottom silicon dioxide tunnel layer.

9. The device of claim 7 further comprises a tunnel barrier layer on the p-type a-Si layer prior to the formation of the aluminum oxide layer.

10. The device of claim 1 wherein the at least one control gate is characterized by a metal layer pattern overlying the second dielectric layer.

11. The device of claim 10 wherein the metal layer pattern comprises titanium.

12. The device of claim 10 wherein the metal layer pattern comprises aluminum.

13. The device of claim 10 wherein the metal layer pattern couples with memory array wordlines electrically.

14. The device of claim 1 wherein the conductive path comprises a re-crystallized channel through the n-type a-Si layer and the p-type a-Si layer.

15. The device of claim 1 wherein the conductive path comprises a breakage region through the second insulation layer.

16. The device of claim 1 with the conductive path comprises a conductive state configured to store data or to read out data stored in a memory cell.

* * * * *